(12) United States Patent
Yao et al.

(10) Patent No.: US 7,679,077 B2
(45) Date of Patent: Mar. 16, 2010

(54) SUPERLATTICE NANO-DEVICE AND METHOD FOR MAKING SAME

(75) Inventors: Yuan Yao, Beijing (CN); Wei-Guo Chu, Beijing (CN); Shou-Shan Fan, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/408,433

(22) Filed: Apr. 21, 2006

(65) Prior Publication Data

US 2007/0057248 A1    Mar. 15, 2007

(30) Foreign Application Priority Data

Apr. 22, 2005    (CN) .................. 2005 1 0034359

(51) Int. Cl.
*H01L 29/15*    (2006.01)
(52) U.S. Cl. .................. 257/15; 257/E29.072; 977/762
(58) Field of Classification Search .................. 257/12, 257/15, 18, 22, E29.072, E33.008, E33.009, 257/E33.01, E31.033; 977/762
See application file for complete search history.

(56) References Cited

U.S. PATENT DOCUMENTS

| | | | |
|---|---|---|---|
| 6,313,015 B1 | 11/2001 | Lee et al. | |
| 6,340,822 B1 * | 1/2002 | Brown et al. | 257/25 |
| 6,605,535 B1 * | 8/2003 | Lee et al. | 438/684 |
| 6,720,240 B2 | 4/2004 | Gole et al. | |
| 6,969,897 B2 * | 11/2005 | Kim, II | 257/432 |
| 2002/0172820 A1 * | 11/2002 | Majumdar et al. | 428/357 |
| 2003/0010971 A1 * | 1/2003 | Zhang et al. | 257/15 |
| 2004/0079278 A1 * | 4/2004 | Kamins et al. | 117/84 |
| 2006/0054881 A1 * | 3/2006 | Li et al. | 257/19 |
| 2006/0131695 A1 * | 6/2006 | Kuekes et al. | 257/618 |
| 2007/0029600 A1 * | 2/2007 | Cohen | 257/315 |

OTHER PUBLICATIONS

"Block-by-Block Growth of Single-Crystalline Si/SiGe Superlattice Nanowires", Nano Letters, 2002, vol. 2, No. 2, 83-86.

* cited by examiner

*Primary Examiner*—Minh-Loan T Tran
*Assistant Examiner*—W. Wendy Kuo
(74) *Attorney, Agent, or Firm*—D. Austin Bonderer

(57) ABSTRACT

A nanodevice (1) for a desired function includes a substrate (11), a one-dimensional nanostructure (12), a functional layer (20) having a desired function, a conductive thin film electrode (30), and an insulating layer (40). The one-dimensional nanostructure is operatively extends from the substrate. The functional layer surrounds at least a portion of the one-dimensional nanostructure. The conducting thin film electrode surrounds/encompasses the functional layer. The insulating layer is positioned between the substrate and the conductive thin film electrode, thereby electrically insulating the one from the other. Further, the nanodevice can incorporate one or more functional units 50, each unit including a one-dimensional nanostructure and a respective functional layer. The units may or may not share the same conductive thin film electrode and/or insulating layer.

16 Claims, 3 Drawing Sheets

SUPERLATTICE NANO-DEVICE AND METHOD FOR MAKING SAME

BACKGROUND OF THE INVENTION

1. Field of the Invention

The present invention relates to nanodevices and methods for making them and, more particularly, to nanodevices having superlattice structures and methods for making such devices.

2. Related Art

Nanotechnology is any technology which exploits phenomena and structures that occur at the nanometer scale, which is usually 0.1~100 nanometers. Generally, nanomaterials involved in nanotechnology can be defined as those have nanostructured components at the nanometer scale. For example, nanomaterials with one dimension in the nanoscale are known as two-dimensional nanomaterials, such as thin films or surface coatings having a thickness at nanometer scale; nanomaterials with two dimensions in the nanoscale are known as one-dimensional nanomaterials, such as nanowires and nanotubes; and nanomaterials with three dimensions in the nanoscale are known as zero-dimensional nanomaterials, such as particles or quantum dots. Due to two principal factors, i.e., increased relative surface area and quantum effects, nanomaterials exhibits significantly different properties from other materials. For example, nanomaterials may have high Young's modulus, increased energy gap, and single electron effects.

It is known in the art that superlattice structures, i.e., composite structures made of alternating ultrathin layers of different component materials, can be made on the nano-scale and have potential applications in such areas, for example, as optoelectronic devices, optical sensors, semiconductors, and thermoelectric transformation. Generally, such superlattice structures are mainly composed of III-V group (such as GaAs/AlGaAs), II-VI group (such as ZnSe/ZnCdSe), and/or IV-IV group (such as Si/GeSi) semiconductor materials. Methods for synthesis of the superlattice structures have mainly included molecular beam epitaxy and chemical vapor deposition.

With the development of nanotechnology, superlattice structure was applied in one-dimensional nanomaterials for extending their functions. For example, Si/GeSi superlattice nanowires, GaAs/GaP superlattice nanowires, InP/InAs superlattice nanowires, and ZnO/InZnO superlattice nanowires have been reported in recent years. These semiconductor superlattice nanowires are all synthesized by vapor-liquid-solid (VLS) method, using gold (Au) or platinum (Pt) particles as the catalyst. The resulting nanowires are composed of different types of superlattice structures alternately stacked in series.

However, the VLS method for synthesizing superlattice nanowires has the following disadvantages:

First, in order to form a hetero-junction and a superlattice, the semiconductor materials must be compatible with the catalyst particles to form an alloy or solid solution at a high temperature. However, some valuable/useful materials do not alloy with gold or platinum. Therefore, possible candidates for the semiconductor material are limited, in that those materials incompatible with the catalyst cannot be applied to the superlattice nanowires.

Second, the VLS method for synthesizing the series-type superlattice nanowires is not compatible with the existing methods for synthesizing superlattice structures. In addition, the height of each of the superlattice structures must be precisely controlled during the VLS method. This need for precise control makes the VLS method difficult to implement.

Third, in order to construct a functional nanodevice, additional processes are needed for assembling and/or integrating the superlattice nanowires with a silicon substrate. The processes may include, e.g., addressing, manipulating, and/or integrating the nanowires. However, the techniques for these processes is premature and/or developmental.

Accordingly, what is needed is a superlattice-based nanodevice structure having a desired function and a method for manufacturing such a nanodevice.

SUMMARY

An embodiment of the present superlattice-based nanodevice includes a substrate, a one-dimensional nanostructure, a functional layer having a desired function, a conductive thin film electrode, and an insulating layer. The one-dimensional nanostructure extends from the substrate. The functional layer surrounds at least a portion of the one-dimensional nanostructure. The conducting thin film electrode surrounds the functional layer. The insulating layer is located between the substrate and the conductive thin film electrode and is thereby configured for creating an insulation therebetween. Further, the nanodevice can incorporate one or more functional units, each unit including a one-dimensional nanostructure and a respective functional layer. The units may or may not share the same conductive thin film electrode and/or insulating layer.

Other systems, methods, features, and advantages will be or become apparent to one skilled in the art upon examination of the following drawings and detailed description. It is intended that all such additional systems, methods, features, and advantages that are included within this description, be within the scope of the present invention, and be protected by the accompanying claims.

BRIEF DESCRIPTION OF THE DRAWINGS

Many aspects of the present superlattice-based nanodevice and the related method for making such a nanodevice can be better understood with reference to the following drawings. The components in the drawings are not necessarily to scale, the emphasis instead being placed upon clearly illustrating the principles of the present superlattice-based nanodevice and the method for making it. Corresponding reference characters indicate corresponding parts throughout the several views.

DETAILED DESCRIPTION OF THE PREFERRED EMBODIMENTS

Reference will now be made to the drawings to describe preferred embodiments of the present superlattice-based nanodevice, in detail.

Figure 1:
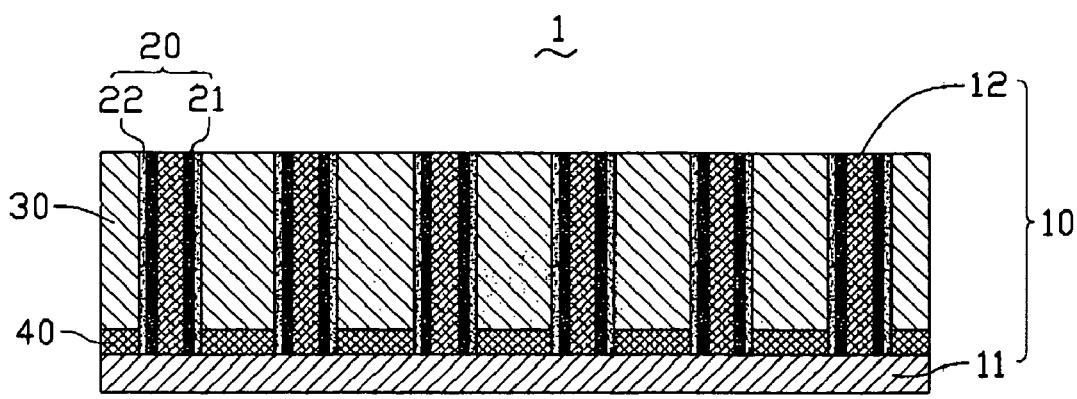
FIG. 1 is a schematic, cross-sectional view of a superlattice-based nanodevice, according to a first embodiment.
Figure 2:
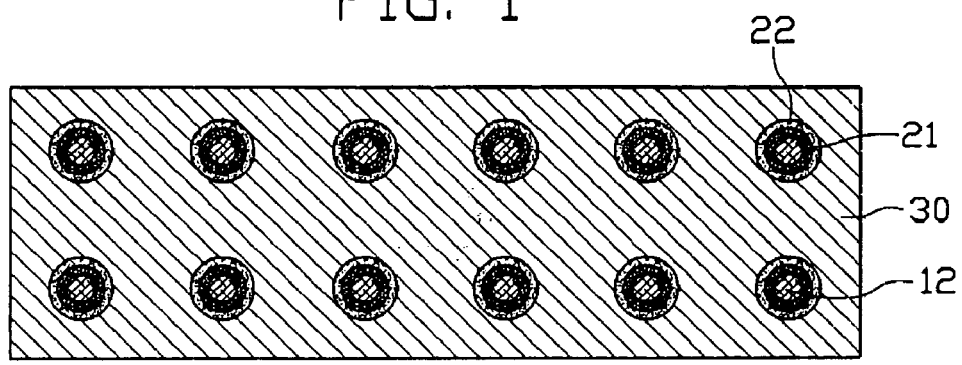
FIG. 2 is a schematic, top view of the nanodevice of FIG. 1.
Figure 3:
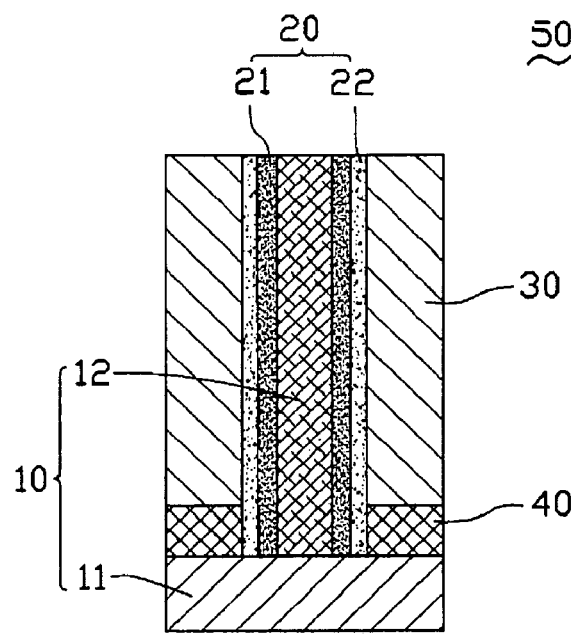
FIG. 3 is a schematic, enlarged cross-sectional view of a unit of the nanodevice of FIG. 1.

Referring to FIGS. 1 to 3, a nanodevice 1 according to a first embodiment is shown. The nanodevice 1 includes a number of units 50 (12 units are shown in FIGS. 1 and 2). The units 50 can be arranged, advantageously, in a regular pattern, such as an array or a matrix.

Each of the units 50 correspondingly includes a first electrode 10, a functional layer 20, a second electrode 30, and an insulating layer 40. The first electrode 10 includes a silicon substrate 11 and a one-dimensional nanomaterial, such as a silicon nanowire 12, formed on the silicon substrate 11. The functional layer 20 includes an annular first thin film 21 adjacently surrounding and contacting the silicon nanowire 12 and an annular second thin film 22 adjacently surrounding the first thin film 12. The functional layer 20 is, in turn, positioned on the silicon substrate 11, in contact therewith. Preferably, a top surface of the functional layer 20, i.e., top surfaces of the first thin film 21 and the second thin film 22, is coplanar with a top surface of the silicon nanowire 12. The insulating layer 40 is formed on the silicon substrate, surrounding a bottom part of the functional layer 20. The second electrode 30 operatively surrounds/adjoins the functional layer 20 and is formed on the insulating layer 40. Therefore, the second electrode 30 is insulated from the first electrode 10 via the insulating layer 40. Preferably, a top surface of the second electrode is coplanar with the top surface of the functional layer 20. As suggested by FIGS. 1-3, adjacent layers and/or elements are advantageously in electrical contact with one another. As such, no electrical arcing between adjacent elements is to be expected.

The second electrode 30 can be composed of a metallic conductive material, such as an aluminum thin film, copper thin film, silver thin film, etc. The insulating layer 40 can be composed of insulative material, such as silicon dioxide.

The two thin films 21, 22 for the functional layer 20 can be semiconductor thin films and/or semiconductor superlattice structures. For example, the two thin films can be a p-type semiconductor (such as p-type Si, p-type Ge) and an n-type semiconductor (such as n-type Si, n-type Ge) constituting a homo or hetero p-n junction, which can be used for photocell.

It is noted that the functional layer 20 is not limited to the two-layered structure. The functional layer 20 can be composed of various structures for a desired functional device, such as a light emitting device, magnetic detector, optical sensor, infrared sensor, read/write magnetic head, gas sensor, biosensor, etc. For example, the functional layer 20 can be composed of a single thin film having a desired function or a multi-layered structure for a desired function. Generally, the functional layer 20, composed of a single thin film, can be used for a light emitting device, optical sensor, gas sensor, biosensor, etc. Examples for such a single structure can be a GaN thin film, which can be used for light emitting diode or laser device, or other semiconductor compound superlattice structures.

The multi-layered structure for the functional layer 20 can be composed of two or more different thin films or superlattice structures stacked together. For example, the functional layer 20 can be at least one of multi-layered thin films composed of IV/IV, III/V, II/VI, and IV/VI semiconductor multilayer and superlattice structure; multi-layered thin films composed of at least one of ferromagnetic/nonmagnetic/ferromagnetic, ferromagnetic/antiferromagnetic/ferromagnetic, and/or ferromagnetic/paramagnetic/ferromagnetic multilayer and/or superlattice structures; a diluted magnetic semiconductor superlattice structure; a spin-valve structure; a giant magnetoresistance structure; and a colossal magnetoresistance structure. The different thin films or superlattice structures can be stacked alternately in a form of A-B-A-B, A-B-A-B-A-B, A-B-C-A-B-C, stacked orderly in a form of A-B-C, A-B-C-D, wherein A, B, C and D represent different thin films or superlattice structures, and/or another orderly arrangement. The following table illustrates some examples:

TABLE 1 multilayered structure for functional layer

| No. | A | B | Stack type | Example |
|---|---|---|---|---|
| 1 | GeSi | Si | A-B-A-B ... | Si/GeSi superlattice structure |
| 2 | GaAs | AlGaAs | A-B-A-B ... | GaAs/AlGaAs superlattice structure |
| 3 | Fe | Cu | A-B-A-B ... | Fe/Cu/Fe/Cu multilayered structure |

The Si/GeSi and GaAs/AlGaAs superlattice structures can be used for infrared sensors, laser devices, and/or light emitting diodes. The Fe/Cu/Fe/Cu multilayered structure can be used for nano spin-valve structures and/or read/write magnetic heads.

It is also noted that the silicon substrate 11 can be substituted for by another semiconductor material, such as germanium. In addition, the one-dimensional nanomaterial does not have to be limited to the silicon nanowire 12. Semiconductor nanorods or nanobelts or non-silicon semiconductor nanowires can be used. Generally, nanowires have an aspect ratio, i.e., length/diameter ratio, greater than 100; nanorods have an aspect ratio less than 100. It is to be further understood that for a plurality of units 50, each unit 50 will each have a unique nanomaterial element 12 and a respective/corresponding functional layer 20 associated therewith. However, it is understood that the substrate 11, the second electrode 30, and/or the insulating layer 40 can potentially be shared between two or more units 50. In the embodiment shown in FIG. 1, the substrate 11, the second electrode 30, and the insulating layer 40 are shared by all the units 50.

Figure 7:
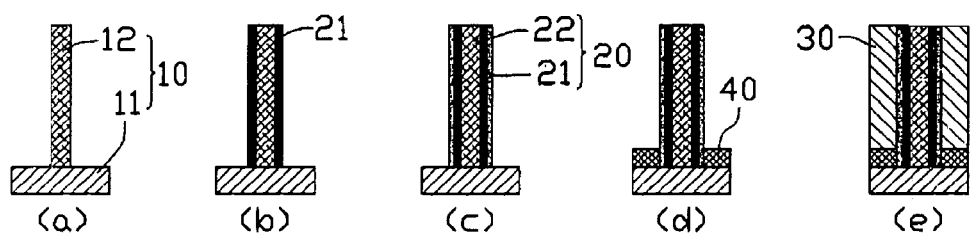
FIG. 7 is a schematic, cross-sectional view showing a process for making the superlattice-based nanodevice, according to the first preferred embodiment.

Referring to FIG. 7, a method for making the nanodevice in accordance with the first embodiment is shown. The method includes the following steps:

(1) providing a substrate with a one-dimensional nanomaterial formed on the substrate. The substrate and the one-dimensional nanomaterial function as a first electrode 10. The substrate 11 is advantageously made of silicon. The one-dimensional nanomaterial is, in this exemplary embodiment, a silicon nanowire 12. The silicon nanowire 12 can be formed on the silicon substrate 11 by any of, e.g., a VLS method, template synthesis method, ion-bean sputtering deposition, magnetron sputtering, thermal chemical vapor deposition method, microwave plasma-enhanced chemical vapor deposition method, and electron cyclotron resonance chemical vapor deposition method.

(2) forming a functional layer 20 on the substrate and surrounding the one-dimensional nanomaterial. In the illustrated embodiment, the functional layer 20 includes a first thin film 21 and a second thin film 22, orderly formed on the silicon substrate 11 and surrounding the silicon nanowire 12. Particularly, the first thin film 21 is formed in contact with a corresponding silicon nanowire 12, with the second film 22 being deposited directly upon the first thin film 21. The first thin film 21 and the second thin film 22 can be formed, for example, by molecular beam epitaxy, thermal chemical vapor deposition, pulsed layer deposition, magnetron sputtering, plasma-enhanced chemical vapor deposition, ion-beam sputtering, electron beam deposition, and/or electrochemical deposition. It is noted that the functional layer 20 is not limited to the two-layered structure. The functional layer 20 can be composed of various structures (in terms of, e.g., number of layers, layer compositions, and/or layer thicknesses) for different functional devices. For example, a single thin film having a desired function (such as a GaN thin film) can be deposited, functioning as the functional layer 20; or a multi-layered structure having different thin films can be provided, thereby serving as the functional layer 20. The multi-layered structure can be composed, for example, of two or more different thin films and/or a superlattice structure stacked in the form of A-B-A-B, A-B-A-B-A-B, A-B-C-D, A-B-C-A-B-C, and/or A-B-C-D-A-B-C-D, wherein A, B, C and D represent different thin films and/or superlattice structures. The method for forming each of the thin films can be similar to the method for forming the first thin film 21 and the second thin film 22.

(3) forming an insulating layer 40 on the substrate 11 and surrounding a bottom portion of the functional layer 20, the bottom portion of the functional layer 20 thereby being at least one of proximate and adjacent to the substrate 11. The insulating layer 40 is advantageously composed of an electrically insulative material, such as silicon dioxide. A method for forming the insulating layer 40 may include, e.g., any one of molecular beam epitaxy, thermal chemical vapor deposition, pulsed laser deposition, magnetron sputtering, plasma-enhanced chemical vapor deposition, hot-filament chemical vapor deposition, metal organic chemical vapor deposition, ion beam deposition, ion beam sputtering, electron-beam deposition, and electrochemical deposition.

(4) forming a second electrode 30 on the insulating layer 40 and surrounding the remaining portion of the functional layer 20 (i.e., that portion not surrounded by insulating layer 40). The second electrode 30 is beneficially composed of a metallic conductive material, such as an aluminum thin film, copper thin film, silver thin film, or a combination of such films. The method chosen for forming the second electrode 30 can be one of, for example, thermal chemical vapor deposition, pulsed laser deposition, magnetron sputtering, plasma-enhanced chemical vapor deposition, hot-filament chemical vapor deposition, metal organic chemical vapor deposition, ion-beam deposition, ion-beam sputtering, electron-beam deposition, or electrochemical deposition. The second electrode 30 is insulated from the first electrode 10.

Figure 4:
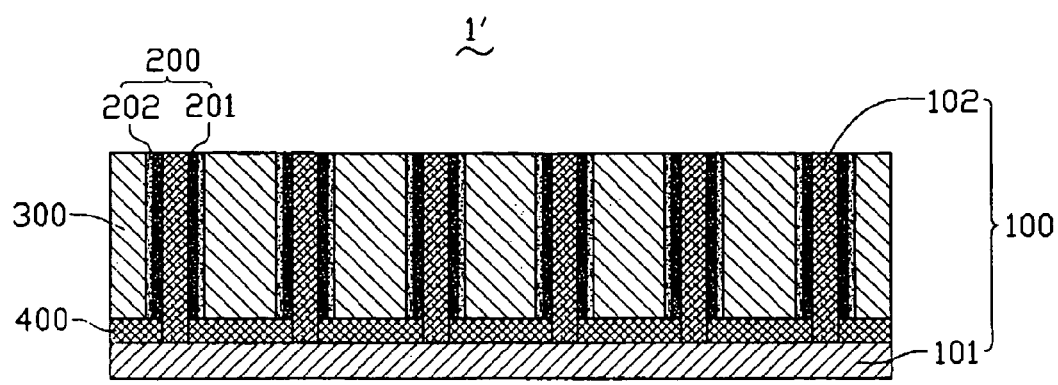
FIG. 4 is a schematic, cross-sectional view of a superlattice-based nanodevice, according to a second preferred embodiment.
Figure 5:
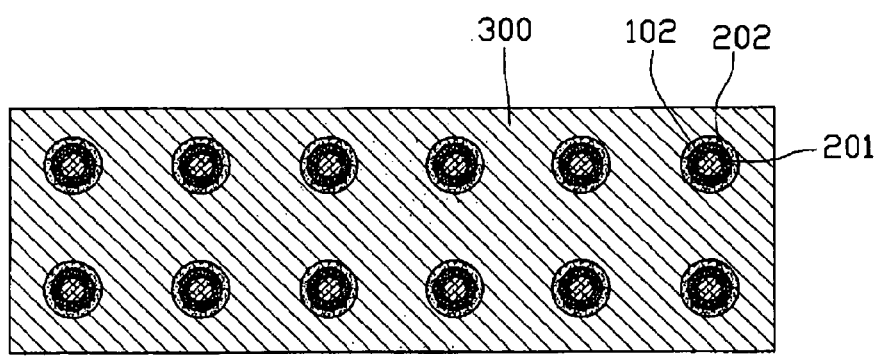
FIG. 5 is a top view of the nanodevice of FIG. 4.
Figure 6:
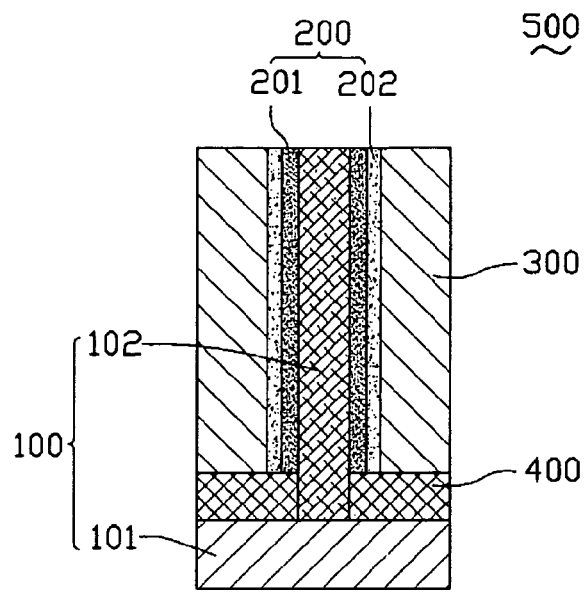
FIG. 6 is a schematic, enlarged cross-sectional view of a unit of the nanodevice of FIG. 4.

Referring to FIGS. 4 to 6, a nanodevice 1' according to a second embodiment is shown. The nanodevice 1' is similar to the first embodiment and includes a number of units 500. The units 500 can be arranged, advantageously, in a regular pattern, such as an array or a matrix.

Each of the units 500 has a structure similar to the unit 50 of the first embodiment, with a first electrode 100, a functional layer 200, a second electrode 300 and an insulating layer 400 that are similar in structure and composition to the first electrode 11, the functional layer 20, the second electrode 30 and the insulating layer 40 of the first embodiment respectively. The first electrode includes a silicon substrate 101 and a silicon nanowire 102 formed on the silicon substrate 101. A different aspect of these two embodiments is that the insulating layer 400 formed an the silicon substrate 101 surrounds a bottom part of the silicon nanowire 102, rather than the bottom part of the functional layer 20. An additional different aspect is that the functional layer 200 of the present embodiment surrounds the remaining part of the silicon nanowire 102 (i.e., the part not surrounded by the insulating layer 400). The functional layer 200 includes an annular first thin film 201 adjacently surrounding and contacting the silicon nanowire 102 and an annular second thin film 202 adjacently surrounding the first thin film 201.

Figure 8:
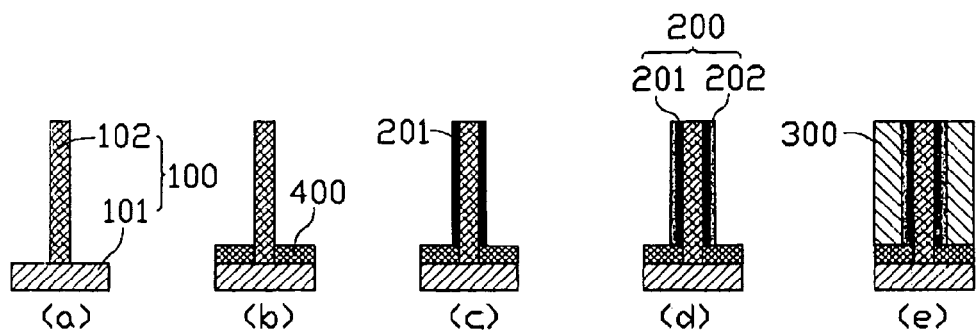
FIG. 8 is a schematic, cross-sectional view showing a process for making the superlattice-based nanodevice, according to the second preferred embodiment.

Referring to FIG. 8, a method for making the nanodevice in accordance with the second embodiment is shown. The present method is similar to the method of the first embodiment, and includes following the steps:

(1) providing a substrate 101 with a one-dimensional nanomaterial formed on the substrate. The substrate 101 and the one-dimensional nanomaterial function as a first electrode 100. The substrate 101 is advantageously made of silicon. The one-dimensional nanomaterial is, for example, a silicon nanowire 102.

(2) forming an insulating layer 400 on the silicon substrate 101 and surrounding a bottom portion of the silicon nanowire 102. The method and composition for the insulating layer 400 is similar to that of the insulating layer 40 in the first embodiment.

(3) forming a functional layer 200 on the insulating layer 400 and surrounding the remaining portion of the silicon nanowire 102. In the illustrated embodiment, the functional layer 200 includes a first thin film 201 and a second thin film 202 that are similar to the structure and composition of the functional layer 20 of the first embodiment.

(4) forming a second electrode 300 on the insulating layer 400 and surrounding the functional layer 200. The second electrode 300 is substantially the same as the second electrode 30 of the first embodiment.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A nanodevice comprising:
   a substrate;
   at least one first electrode comprising a one-dimensional nanostructure extending from the substrate;
   at least one functional layer having a desired function, each functional layer contacting and surrounding at least a portion of a corresponding one-dimensional nanostructure, wherein at least one said functional layer comprises at least one of:
      a semiconductor compound superlattice thin film,
      a multi-layered semiconductor superlattice structure,
      a multi-layered structure,
      a diluted magnetic semiconductor multi-layered superlattice structure,
      a spin-valve structure,
      a giant magnetoresistance structure, and
      a colossal magnetoresistance structure;
      wherein the multi-layered structure comprises of at least one of:
         ferromagnetic/nonmagnetic/ferromagnetic,
         ferromagnetic/antiferromagnetic/ferromagnetic, and
         ferromagnetic/paramagnetic/ferromagnetic superlattice structures;
   at least one second electrode of a conductive thin film contacting and surrounding at least one functional layer; and
   at least one insulating layer positioned between the substrate and a corresponding second electrode, each insulating layer thereby being configured for electrically insulating the substrate from the second electrode corresponding thereto;

wherein a top surface of the at least one first electrode and a top surface of the at least one functional layer are uncovered.

2. The nanodevice as described in claim 1, wherein the one-dimensional nanostructure has two dimensions in a nanometer scale.

3. The nanodevice as described in claim 2, wherein the one-dimensional nanostructure is one of a nanowire, a nanorod, and a nanobelt.

4. The nanodevice as described in claim 1, wherein at least one said functional layer is composed of a single thin film having a desired function.

5. The nanodevice as described in claim 1, wherein at least one said functional layer is a multi-layered structure composed of at least two thin films, the at least two thin films being stacked in a sequence and thereby being configured for achieving a desired function.

6. The nanodevice as described in claim 1, wherein the multi-layered semiconductor superlattice structure is comprised of at least one structure chosen from the group consisting of IV/IV, III/V, II/VI, and IV/VI semiconductor superlattice structures.

7. The nanodevice as described in claim 1, wherein at least one said insulating layer is deposited on the substrate and encompasses a bottom portion of at least one said one-dimensional nanostructure.

8. The nanodevice as described in claim 1, wherein at least one said insulating layer is deposited on the substrate and encompasses a bottom portion of at least one said functional layer.

9. The nanodevice as described in claim 1, wherein each insulating layer is composed of silicon dioxide.

10. The nanodevice as described in claim 1, comprising:
a plurality of one-dimensional nanostructures extending from the substrate; and
a plurality of functional structures, each functional structure surrounding at least a portion of a respective one-dimensional nanostructure.

11. The nanodevice as described in claim 10, wherein a single insulating layer is deposited on the substrate and encompasses a bottom portion of the one-dimensional nanostructures.

12. The nanodevice as described in claim 10, wherein a single insulating layer is deposited on the substrate and encompasses a bottom portion of the functional structures.

13. The nanodevice as described in claim 10, wherein a single conductive thin film electrode surrounds the functional structures.

14. The nanodevice as described in claim 10, wherein the one-dimensional nanostructures are comprised of silicon.

15. A nanodevice comprising:
a substrate;
at least one one-dimensional nanostructure extending from the substrate;
at least one functional layer having a desired function, each functional layer contacting at least a portion of a corresponding one-dimensional nanostructure, wherein the at least one functional layer comprises at least one of:
a spin-valve structure,
a giant magnetoresistance structure,
a colossal magnetoresistance structure, and
a multi-layered structure;
wherein the multi-layered structure comprises at least one of:
ferromagnetic/nonmagnetic/ferromagnetic,
ferromagnetic/antiferromagnetic/ferromagnetic, and
ferromagnetic/paramagnetic/ferromagnetic superlattice structures;
at least one conductive thin film electrode contacting at least one functional layer; and
at least one insulating layer positioned between the substrate and a corresponding conductive thin film electrode, each insulating layer thereby being configured for electrically insulating the substrate from the conductive thin film electrode corresponding thereto.

16. A nanodevice comprising:
a substrate;
at least one first electrode comprising a one-dimensional nanostructure extending from the substrate;
at least one functional layer having a desired function, each functional layer contacting and surrounding at least a portion of a corresponding one-dimensional nanostructure, wherein at least one said functional layer comprises at least one of:
a semiconductor compound superlattice thin film,
a multi-layered semiconductor superlattice structure,
a multi-layered structure,
a diluted magnetic semiconductor multi-layered superlattice structure,
a spin-valve structure,
a giant magnetoresistance structure, and
a colossal magnetoresistance structure;
wherein the multi-layered structure comprises of at least one of:
ferromagnetic/nonmagnetic/ferromagnetic,
ferromagnetic/antiferromagnetic/ferromagnetic, and
ferromagnetic/paramagnetic/ferromagnetic superlattice structures;
at least one second electrode of a conductive thin film contacting and surrounding at least one functional layer; and
at least one insulating layer positioned between the substrate and a corresponding second electrode, each insulating layer thereby being configured for electrically insulating the substrate from the second electrode corresponding thereto;
wherein the at least one functional layer directly contacts the substrate.

* * * * *